United States Patent [19]

Uittenbogaard et al.

[11] Patent Number: 5,216,383

[45] Date of Patent: Jun. 1, 1993

[54] CONTROLLABLE AMPLIFIER CIRCUIT

[75] Inventors: Teunis H. Uittenbogaard; Louis Praamsma, both of Nijmegen, Netherlands

[73] Assignee: U.S. Philips Corporation, New York, N.Y.

[21] Appl. No.: 872,938

[22] Filed: Apr. 23, 1992

[30] Foreign Application Priority Data

May 21, 1991 [EP] European Pat. Off. ........ 91201207.7

[51] Int. Cl.$^5$ .............................................. H03G 3/30
[52] U.S. Cl. ..................................... 330/279; 330/277; 330/311
[58] Field of Search ............... 330/277, 278, 279, 285, 330/300, 311

[56] References Cited

U.S. PATENT DOCUMENTS 3,443,240 5/1969 Santilli ........................... 330/285 X

FOREIGN PATENT DOCUMENTS 846 1/1979 Japan .................................. 330/285

Primary Examiner—James B. Mullins
Attorney, Agent, or Firm—Bernard Franzblau

[57] ABSTRACT

A controllable amplifier circuit includes, successively, in a cascode arrangement between a power supply voltage and ground, a control transistor and a field effect amplifier transistor having a control input for applying a gain control signal thereto and a gate input for applying an input signal thereto, respectively, via which control transistor the field effect amplifier transistor supplies an output signal to a signal output of the controllable amplifier circuit. The control transistor varies the working point of the field effect amplifier transistor in the ohmic range in dependence upon the gain control signal, at least in a part of the control range of the gain control signal. The circuit can be used with a low power supply voltage because the controllable amplifier circuit includes a controllable bias circuit which is coupled to the gate input of the field effect amplifier transistor for applying a controllable bias voltage thereto. This voltage varies in the opposite direction to the gain control signal mainly in said part of the control range.

14 Claims, 3 Drawing Sheets

CONTROLLABLE AMPLIFIER CIRCUIT

BACKGROUND OF THE INVENTION

This invention relates to a controllable amplifier circuit comprising successively, in a cascode arrangement between a power supply voltage and ground, a control transistor having a control input for applying a gain control signal thereto and a field effect amplifier transistor for a controllable amplification of an input signal applied to a gate input, said control transistor varying the working point of the field effect amplifier transistor in the ohmic range depending upon the gain control signal, at least in a part of the control range of the gain control signal.

A controllable amplifier circuit of this type is known, inter alia, from Japanese Patent publication no. 62-187145.

In the known controllable amplifier circuit the cascode arrangement of the field effect amplifier transistor (FET) and the control transistor is realised by means of first and second field effect transistors (FETs), respectively of a two-port FET tetrode, hereinafter also referred to as an amplifier tetrode. The first FET amplifies a high-frequency input signal applied to its gate input, hereinafter referred to as the first gate. The gain factor of this first FET is dependent on its working point. This working point is controlled mainly by controlling the drain-source voltage. To this end, the second FET operating as a control transistor, varies the drain voltage of the first FET depending upon the gain control signal which is applied to the second gate, i.e. the gate input of the second FET. The gain of the first FET is maximal in an initial or uncontrolled state of the gain control. In this state the working point of the first FET is controlled by a maximum drain-source voltage in the saturation range. This is achieved at an initial maximum value of the gain control signal. Since the source voltage of the second FET approximately follows its gate voltage and is equal to the drain voltage of the first FET, a decrease of the gain control signal at least results initially in a decrease of the drain-source voltage and hence of the gain of the first FET. In the output characteristic, or $I_D$-$V_{DS}$ characteristic of this first FET, such a decrease of the gain control signal results in a shift of its working point through the saturation range and towards the ohmic range.

In the case of a continuing decrease of the gain control signal, it reaches said part of the control range after it has passed a given value, hereinafter referred to as the threshold value. At this threshold value the first FET comes out of its saturated state. The first FET then has its working point in the transition range between the saturation range and the ohmic range, also referred to as the knee region. A decrease of the gain control signal in this part of the control range results in a much stronger decrease of the drain current $I_D$ of the FET tetrode than a comparable decrease of the gain control signal in the preceding part of the control range. Consequently, the gain of the first FET strongly decreases from this threshold value with a decreasing amplitude of the gain control signal. Since the gate-source voltage and hence the non-linearities do not change, the distortion and cross-modulation effects caused by these non-linearities in the first FET increase considerably with respect to the output signal amplitude.

To reduce these non-linearities, the source of the first FET in the known controllable amplifier circuit is connected to ground via a source resistor. Since the voltage across this source resistor varies with the drain current $I_D$ of the FET tetrode, a DC negative feedback is obtained which increases the gate-source voltage in the case of a decrease in gain. A certain degree of linearization is then obtained.

The extent of linearization increases with the value of the source resistor. However, the required power supply voltage also increases with the source resistance. In practice, limits are imposed on the value of the power supply voltage and particularly when the supply is provided by means of batteries, the required power supply voltage should be as low as possible. This imposes limits on the linearization of the known controllable amplifier circuit.

SUMMARY OF THE INVENTION

It is an object of the invention to provide a controllable amplifier circuit of the type described in the opening paragraph which does not have said limitation or has this limitation to a much lesser extent and with which a linear gain is possible in a control range which is at least equal to that of the known controllable amplifier circuit at a power supply voltage which may be considerably lower than that of the known controllable amplifier circuit.

A controllable amplifier circuit according to the invention is therefore characterized in that the control input also is coupled via a controllable bias circuit to the gate input of the field effect amplifier transistor for applying a controllable bias voltage thereto, which voltage varies in the opposite direction to the gain control signal mainly in said part of the control range.

The measure is based on the recognition that a decreasing gain control signal at the gate of the second FET results in a gain reduction for working points of the first FET outside the saturation range, even if the DC bias voltage of the gate of the first FET increases.

When using the measure according to the invention, this recognition is utilized to increase the gate-source voltage of the first FET and hence it inhibits the occurrence of non-linearities in this part of the control range mainly for working points of the first FET outside the saturation range at a decreasing drain voltage and a constant source voltage. This measure provides the possibility of directly connecting the source of the first FET to ground with respect to the DC voltage. In contrast to the known controllable amplifier circuit, since no use is made of a source resistor and since there is no voltage loss between the source and ground, the power supply voltage may be much lower.

By suitably dimensioning the controllable bias circuit it can be achieved that, with a variation of the gain control signal, a variation of the controllable bias voltage at the gate of the first FET is obtained such that the distortion in the first FET in the entire control range does not exceed a given admissible value.

For example, it is possible to increase the gain of the controllable bias circuit in the case of an increasing gain reduction due to a descreasing gain control signal in such a way that the controllable bias voltage at the gate of the first FET for working points in the saturation range does not increase or hardly increases with a decreasing gain control signal and that it increases considerably with this signal for working points outside said range.

Such a controllable amplifier circuit according to the invention is preferably characterized in that the controllable bias circuit comprises a threshold phase inverter stage for inverting the phase of the gain control signal which is mainly active for variations of the gain control signal in said part of the control range, said part being limited by a threshold value at which the field effect amplifier transistor has its working point in the transition range between the saturation range and the ohmic range.

When this measure is used, the effective operating range of the controllable bias circuit is limited to the range in which the first FET is turned off and a decreasing gain control signal can be prevented from resulting in an unwanted increase of the gain for working points of the first FET in the saturation range.

A further preferred embodiment of such a controllable amplifier circuit, which is characterized in that the phase inverter stage comprises, successively, in a cascode arrangement between ground and the power supply voltage a further field effect transistor and a controllable resistor, the gate-source junction of the further field effect transistor being parallel to the gate-source junction of the field effect amplifier transistor at a maximum gain of the field effect amplifier transistor for forming a current mirror therewith, said phase inverter stage also comprising means for realising said threshold value.

When this measure is used, a simple adjustment of the quiescent current of the controllable amplifier circuit in the uncontrolled state and hence of the gain control range is possible.

For a simple implementation of the controllable bias circuit, the last-mentioned embodiment is preferably characterized in that the further field effect transistor and the controllable resistor of the controllable bias circuit are constituted by first and second transistors, respectively, of a field effect transistor bias tetrode having first and second gates, a source and a drain, the gain control signal being applied to said second gate, said source being connected to ground, said first gate being short-circuited with the drain and said drain being connected to the power supply voltage via a load resistor and to the gate of the field effect amplifier transistor via a series resistor.

To reduce noise and signal losses as a result of a load of the input signal by the controllable bias circuit, the controllable amplifier circuit according to the invention is preferably characterized in that the controllable bias circuit has a high-ohmic output impedance which is, for example, obtainable by incorporating a series resistor between the bias circuit and the gate input of the field effect amplifier transistor.

To optimize the gain control, a threshold voltage in the last-mentioned embodiment is preferably realised by choosing the ratio between the width and the length of the gate of the second transistor to be smaller than that of the first transistor of said field effect transistor bias tetrode.

The spread in transistor parameters between the transistors of the controllable bias circuit and said first and second FETs is compensated for in a further preferred embodiment which is characterized in that the field effect amplifier transistor and the control transistor are constituted by first and second transistors, respectively, of a field effect transistor amplifier tetrode which together with said field effect transistor bias tetrode are integrated on a common substrate.

Other preferred embodiments are characterized in that the phase inverter stage includes a transistor which has an input electrode to which the gain control signal is applied via a voltage divider for adjusting said threshold value, a reference electrode which is connected to ground and an output electrode which is connected to the power supply voltage via a load resistor and is coupled to the gate of the field effect amplifier transistor.

BRIEF DESCRIPTION OF THE DRAWING

The invention will be described in greater detail with reference to the accompanying drawing. The Figures in the drawing only serve to illustrate the invention. In the Figures elements whose functions correspond have the same reference labels.

In the drawing.

DESCRIPTION OF THE PREFERRED EMBODIMENTS

Figure 1:
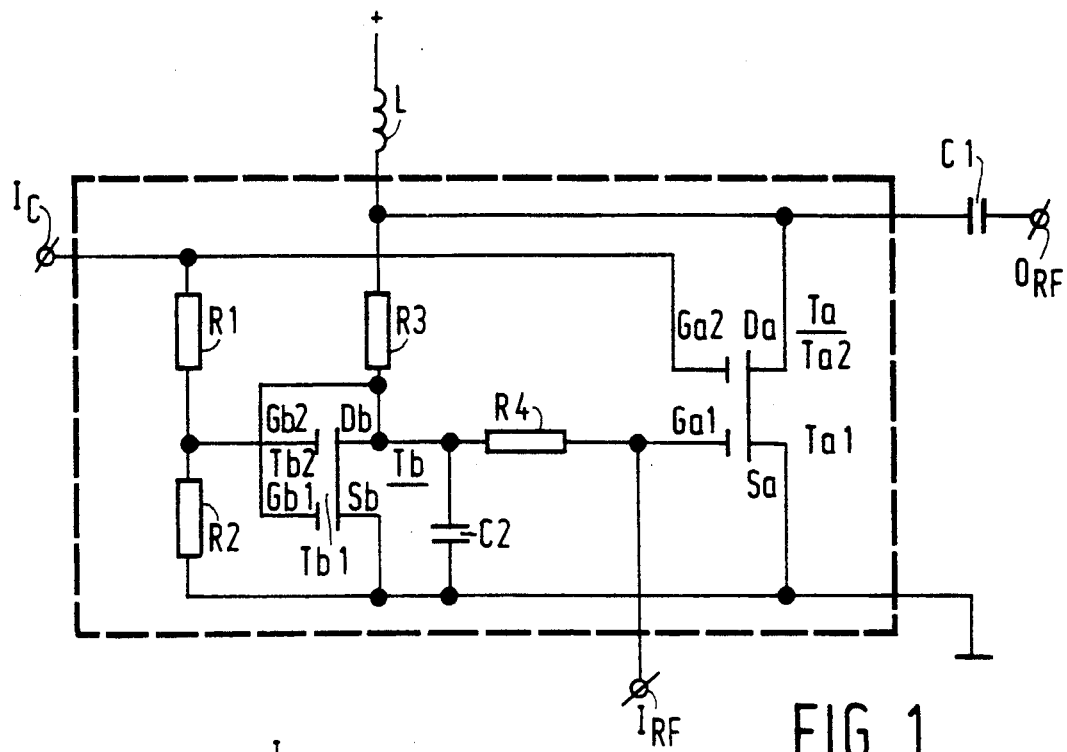
FIG. 1 shows a controllable amplifier circuit according to the invention.

FIG. 1 shows a controllable amplifier circuit according to the invention having a radio frequency signal input $I_{RF}$ for supplying a radio frequency input signal, a radio frequency signal output $O_{RF}$ from which a radio frequency output signal is supplied which is gain-controlled, and a control input $I_C$ for applying a gain control signal thereto. Said controllable amplifier circuit comprises a two-port field effect transistor (FET) tetrode Ta, hereinafter also referred to as an amplifier tetrode, first and second FETs Ta1 and Ta2 of which are arranged in cascode between a power supply voltage and ground. The gates Ga1 and Ga2 of the first FET Ta1 and second FET Ta2 constitute the first and second gate inputs, respectively, of the amplifier tetrode Ta, while the source Sa of the first FET Ta1 and the drain of the second FET Ta2 constitute the source and the drain, respectively, of the amplifier tetrode Ta. The first FET Ta1 operates as an amplifier transistor and the second FET Ta2 operates mainly as a control transistor. A radio frequency input signal is applied to the gate Ga1 of the first FET Ta1 via the radio frequency (RF) signal input $I_{RF}$. The source Sa of this first FET Ta1 is connected to ground, while the drain of Ta1 also constitutes the source of the second FET Ta2. A gain control signal is applied to the gate Ga2 of the second FET Ta2 via the control input $I_C$. The drain Da of the second FET Ta2 is connected to the power supply voltage via a radio frequency leakage inductance L and to the radio frequency signal output $O_{RF}$ via a coupling capacitor C1.

The control input $I_C$ is also connected to a controllable bias circuit which is constituted by a two-port FET tetrode Tb hereinafter also referred to as bias tetrode Tb which, similar to as the amplifier tetrode Ta, comprises a cascode arrangement of a first FET Tb1 and a second FET Tb2. The gates of the first and second FETs Tb1 and Tb2 constitute the first and second gates, respectively, of the bias tetrode Tb, while the source Sb of the first FET Tb1 and the drain of the second FET Tb2 constitute the source and the drain, respectively, of the bias tetrode Tb. The first gate Gb1 of the bias tetrode Tb is short-circuited with the drain Db of the second FET Tb2. The source Sb of the first FET Tb1 is connected to ground, while the drain Db of the second FET Tb2 is connected to the power supply voltage via a resistor R3. In the embodiment shown the resistor R3 is commonly coupled to the drain Da of Ta2 via the radio frequency leakage inductance L. Since the radio frequency leakage inductance L is mainly used to separate the bias tetrode Tb with respect to the radio frequency from the amplifier tetrode Ta, it is alternatively possible to connect the resistor R3 directly to the power supply voltage. The drain Db of the bias tetrode Tb is coupled to the gate Ga1 of the first FET Ta1 via a series resistor R4. This drain Db is also radio-frequency short-circuited to ground via a short-circuit capacitor C2. The control input $I_C$ is connected to the second gate Gb2 of the bias tetrode Tb via a voltage divider R1, R2.

Figure 5:
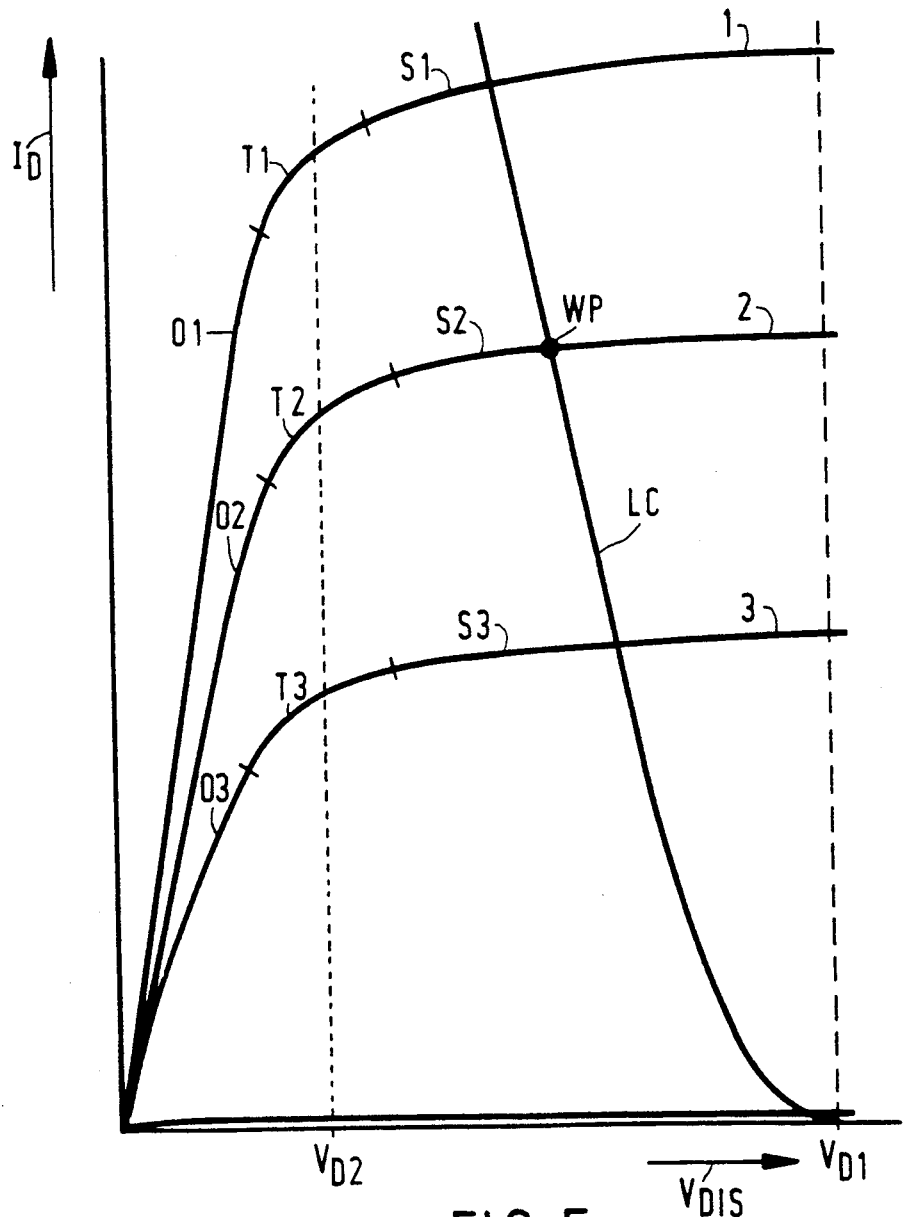
FIG. 5 shows the output characteristic curve, or $I_D$-$V_{DS}$ characteristic curve of the first FET in a controllable amplifier circuit according to the invention.

Reference is made to the graph of FIG. 5 for the following description of the operation of the controllable amplifier circuit shown in FIG. 1. The curves 1, 2 and 3 in FIG. 5 show the variation of the drain current $I_D$ of the amplifier transistor Ta1 as a function of the drain-source voltage $V_{D1S}$, i.e. the voltage between the drain $V_{D1}$ and the source $V_S$ of the first FET Ta1 of the amplifier tetrode Ta with the gate-source voltage $V_{G1S}$ as a parameter. Starting from a gate-source voltage $V_{G1S}$ of 1.5 Volts, curve 1 shows the variation of the drain current $I_D$ as a function of the drain-source voltage $V_{D1S}$ of Ta1, curve 2 shows the same variation at a gate-source voltage $V_{G1S}$ of 1 Volt and curve 3 shows the same variation at a gate-source voltage $V_{G1S}$ of 0.5 Volt. Each curve 1 to 3 can be distinguished in three ranges succeeding each other with a drain-source voltage $V_{D1S}$ increasing from 0, which ranges are an ohmic range O1, O2, O3, a transition range T1, T2, T3 and a saturation range S1, S2, S3. In the ohmic range the drain current $I_D$ of the first FET Ta1 approximately increases linearly with the drain-source voltage $V_{D1S}$. In this ohmic range O1, O2, O3 the slope of the line tangential to the curves 1, 2, 3 is substantially constant and relatively large and decreases for the curves with a decreasing gate-source voltage $V_{G1S}$. When the drain-source voltage $V_{D1S}$ of the first FET Ta1 in the next transition range T1, T2, T3 increases, the slope of the line tangential to the curves 1, 2, 3 decreases in magnitude: here the drain current $I_D$ increases much less rapidly with the increases in the drain-source voltage $V_{D1S}$ than in it does in the ohmic range. The transition ranges T1, T2, T3 are followed by the saturation ranges S1, S2 and S3 for a further increasing drain-source voltage $V_{D1S}$. In these saturation ranges S1, S2 and S3 the drain current $I_D$ only increases to a small extent with an increasing drain-source voltage $V_{D1S}$. Consequently, the slope of the curves 1, 2, 3 in the saturation ranges S1, S2, S3 is substantially constant and comparatively low, while the value of the drain current $I_D$ in this saturation range, also referred to as the quiescent current, is lower as the gate-source voltage $V_{G1S}$ is lower.

In the uncontrolled state the first FET Ta1, operating as an amplifier transistor, is adjusted to a maximum gain, i.e. the working point of the first FET Ta1 is adjusted in the saturation range. By way of example, FIG. 5 shows this uncontrolled working point, also referred to as the quiescent or initial working point, which is indicated by a point WP on the curve 2. This curve 2 intersects the load curve LC at the point WP. The load curve LC is determined by the load which is formed at the drain of Ta1 by the second FET Ta2.

The initial working point is obtained by adjusting the gain control signal applied to the gate Ga2 of the second FET Ta2, operating as a control transistor, to a maximum value, for example, 4 Volts. This second FET Ta2 also has its working point in the saturation range, which substantially does not change during the gain control. The drain of the second FET Ta2 is coupled to a power supply voltage of 5 Volts, while the source of the first FET Ta1 is connected to ground. At the maximum voltage at the gate Ga2 the source of Ta2 is adjusted to a maximum value (for example, 3 Volts in the specific case) so that the drain-source voltage $V_{D1S}$ of the first FET Ta1 and the drain current $I_D$ of Ta1 have a maximum value.

The gain control signal applied to the control input $I_C$ is also applied to the second gate of the bias tetrode Tb, i.e. the gate Gb2 of the second FET Tb2 of the bias tetrode Tb via the voltage divider R1 and R2. In the said quiescent state a gate voltage is obtained at this second gate Gb2, which voltage is high enough to give the second FET Tb2 from the drain to the source such a low-ohmic value that a short-circuit state can be assumed to be present. As already mentioned hereinbefore, the first gate Gb1 of the bias tetrode Tb is short-circuited with the drain Db of this bias tetrode Tb and the source of this first FET Tb1 is connected to ground. Since no current is applied to the first gate Ga1 of the amplifier tetrode Ta, there is no voltage across the series resistor R4 and the voltage at the first gate Ga1 is equal to the voltage at the first gate Gb1 of the bias tetrode Tb. Consequently, the first FET Tb1 of bias tetrode Tb together with the first FET Ta1 of the amplifier tetrode Ta operates as a current mirror in this uncontrolled state. The drain current $I_D$ of the amplifier transistor Ta1 can be simply adjusted to an initial or quiscent value in this way by means of a suitably chosen value for the resistor R3.

A gain reduction is obtained by causing the amplitude of the gain control signal at the gate Ga2 of Ta2 to decrease. As a result of the voltage decrease at the gate Ga2, the voltage at the source of Ta2 also decreases. Since the last-mentioned source voltage of Ta2 is equal to the drain voltage $V_{D1}$ of Ta1, the drain-source voltage of Ta1 also decreases. As a result, the drain current $I_D$ also decreases to a slight extent with the decreasing drain-source voltage $V_{D1S1}$ of Ta1 and in the given example the working point (WP) of the first FET Ta1 moves across the curve 2 in the saturation range S2 towards the transition range T2, which is accompanied by a gain reduction.

The division factor of the voltage divider R1 and R2 is chosen such that, starting from the uncontrolled state, a decrease of the gain control signal at the control input $I_C$ does not cause or hardly causes a change of the aforementioned quiescent state of bias tetrode Tb, in so far as Ta1 does not come out of its saturated state, i.e. as long as the working point of the first amplifier FET Ta1 is in the saturation range (S2 of curve 2). In practice this appears to correspond to a gain reduction of 6 to 10 dB. The voltage at the gate Gb2 does not decrease to an efficient extent until the drain-source voltage $V_{DIS}$ of the amplifier transistor Ta1 has decreased so far that the working point of Ta1 reaches the transition range T1, so that the second FET Tb2 of the bias tetrode Tb, from the source to the drain, shows a resistance which increases with a decreasing voltage at Gb2. As a result, the current mirror action of Tb1 with Ta1 is lost and the drain current $I_D$ through the bias tetrode Tb decreases so that the current through the resistor R3 also decreases and the voltage at the drain Db of Tb increases. Since no current flows through the series resistor R4, the voltage at the gate Ga1 of the amplifier FET Ta1 follows the voltage at the drain Db of the bias tetrode Tb, hence it increases. The controllable bias circuit constituted by the bias tetrode Tb and the resistors R1 to R4 can therefore be considered as a phase inverter stage because a decrease of the gain control signal at the control input $I_C$ results in an increase of the voltage at the first gate Ga1 of the amplifier FET Ta1. The operating range of this phase inverter stage is determined by an input threshold voltage which can be adjusted by means of the voltage divider R1 and R2. In the relevant example the gain control signal reaches this input threshold voltage at a working point of Ta1 in the transition range (T2) between the saturation range (S2) and the ohmic range (O2 on curve 2). With a further decrease of the gain control signal at the control input $I_C$, the drain-source voltage $V_{DIS}$ of the amplifier FET Ta1 also decreases further until the working point of this amplifier FET Ta1 reaches the ohmic range (O2).

Due to this further decrease of the gain control signal, the voltage at the gate Gb2 further decreases via the voltage divider R1, R2 and the resistance of the second FET Tb2 of the bias tetrode Tb from the source to the drain further increases. This causes a further decrease of the drain current $I_D$ of the bias tetrode Tb and a further increase of the drain voltage at the drain Db of the bias tetrode Tb and hence of the voltage at the first gate Ga1 of the amplifier FET Ta1.

Since the source Sa of the amplifier FET Ta1 is connected to ground, an increase of the voltage at the gate Ga1 directly corresponds to an increase of the gate-source voltage $V_{G1S}$. Notably in this ohmic range and even at said comparatively low power supply voltage of 5 Volts, an AC-DC ratio of the RF input signal to be amplified is obtained which is favourable for a linear gain and which is maintained while preserving an effective gain control.

Since an increase of the gate-source voltage $V_{G1S}$ of the amplifier FET Ta1 in this ohmic range will result in an increase in the slope of the $I_D$–$V_{DIS}$ characteristic curve (the working point of Ta1 then follows the curve 1 instead of curve 2), i.e. a decrease of the output impedance of Ta1, an extra reduction of interference components is obtained. In fact, the interference voltages at the output of the amplifier FET Ta1 decrease with said output impedance of Ta1.

For working points of the amplifier FET Ta1 outside the saturation range the gain of the amplifier FET Ta1 decreases with a decreasing gain control voltage at the gate Ga2 of the control transistor FET Ta2 in spite of an increase of the controllable bias voltage at the gate Ga1 of the amplifier FET Ta1, and conversely. In this bias range the gain varies unambiguously with the gain control signal.

For working points of the amplifier FET Ta1 in the saturation range, however, an increase of the voltage at the gate Ga1 of Ta1 may completely defeat the gain reduction due to a decrease of the gain control signal at the gate Ga2 of the control transistor FET Ta2 and may even give rise to an increase in gain. To prevent this, the voltage at the gate Ga1 of Ta1 should not increase noticeably until the gain control voltage at the gate Ga2 of the FET Ta2 has decreased when the amplifier transistor Ta1 is biased in the ohmic range. This can be achieved by a correct dimensioning of the bias circuit, while the current through the bias tetrode Tb is not decreased noticeably for biasing Ta1 in the ohmic range until the gain control signal has decreased.

In the afore-described controllable amplifier circuit according to the invention, the control behavior is optimized by applying the gain control signal from the control input $I_C$ to the gate Gb2 of the bias tetrode Tb via a voltage divider R1, R2 operating as a threshold circuit. However, it is feasible that the above-mentioned unwanted control behaviour in the saturation range of Ta1 is avoided in a different way, for example, by incorporating a threshold circuit having a suitably chosen threshold value between the controllable bias circuit and the gate input of the amplifier transistor Ta1.

However, the part of the gain control range in which the amplifier FET Ta1 is saturated is comparatively small in practice as compared with the entire gain control range and is only 6 to 10 dB out of 40 to 60 dB.

In the embodiment, shown in FIG. 1, of the controllable amplifier circuit according to the invention the amplifier transistor and the control transistor are realised by means of a FET tetrode. It will be evident that the inventive idea is also applicable to the use of a field effect transistor as an amplifier transistor arranged in cascode with bipolar transistor as a control transistor. It is likewise feasible to replace the bias tetrode Tb by a FET which operates like the first FET Tb1 and a controllable resistor which operates like the second FET Tb2 of the bias tetrode Tb. This controllable resistor should then be varied in value in dependence upon the gain control signal.

The value of the series resistor R4 is chosen to be sufficiently high to prevent the input signal applied to the radio frequency signal input $I_{RF}$ from flowing to ground via the decoupling capacitor C2 and to insure that the signal energy of the radio frequency input signal is applied to the gate input Ga1 of the amplifier FET Ta1. An improvement of the signal-to-noise ratio is obtained with the series resistor R4.

In practical trial set-ups the power supply voltage was 5 Volts; the resistors R1-R4 had values of 10 kOhms, 40 kOhms, 25 to 30 kOhms and 50 to 100 kOhms, respectively, and the capacitors C1 and C2 had values of 4700 pF and 10 pF, respectively.

In an embodiment in an integrated form in which at least the first FET Ta1 of Ta is formed on the same substrate as Tb, mutual differences in the transistor parameters due to spreading are minimized and the effect of the absolute spreading on the biasing of the quiescent current is compensated for by means of the load resistor R3.

Optimization of the control behavior may be possible by choosing the ratio between the width and the length of the gate of the second transistor Tb2 to be smaller than that of the first transistor Tb1 of the bias FET tetrode Tb. In the case of correctly chosen ratios, the voltage divider R1, R2 can be dispensed with, i.e. R1 can be short-circuited (R1=0Ω) and R2 can be omitted (R2=∞). If Tb is so small that the gates of Tb have a very small width (at least 50× smaller than that of the gates of Ta), R4 and C2 can then also be dispensed with, i.e. R4=0Ω and C2=0 pF.

Figure 2:
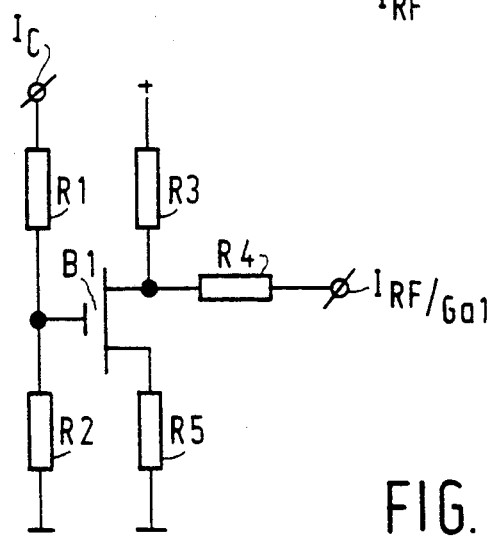
FIGS. 2 to 4 show alternative embodiments of a controllable bias circuit for use in a controllable amplifier circuit according to the invention.
Figure 3:
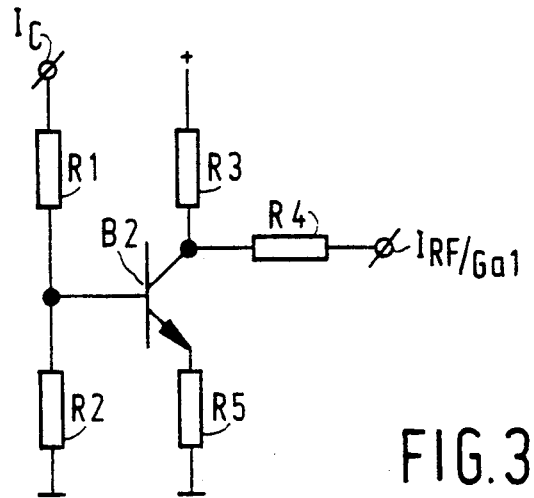
Figure 4:
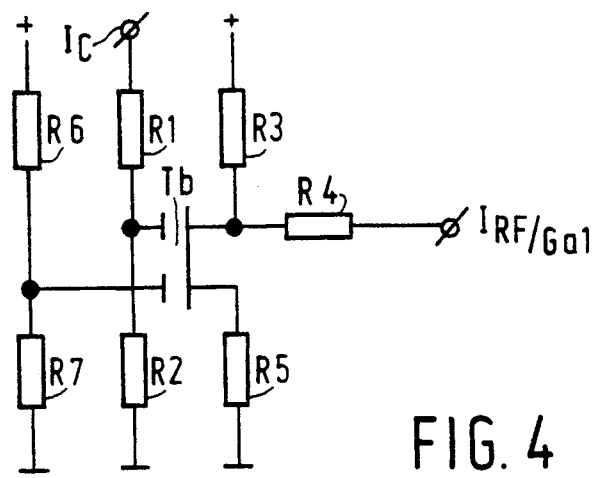

Alternative embodiments of the controllable bias circuit are shown in FIGS. 2 to 4.

FIG. 2 shows a bias FET B1 arranged in common source configuration whose gate, source and drain constitute input, reference and output electrodes, respectively. The gain control signal whose amplitude has been given a correct value is applied to the gate via the voltage divider R1 and R2. The source of the bias FET B1 is connected to ground via a source resistor R5. In the uncontrolled state, i.e. at a maximum value of the gain control signal at control input $I_C$, the voltage at the gate of B1 is also maximum so that the drain current of B1 and hence the voltage across the resistor R3 are maximum. The voltage at the drain of B1 is minimum as well as the voltage at the first gate Ga1 of the amplifier transistor Ta1. When the gain control signal decreases, the voltage at the gate of B1 decreases and hence the drain current through B1 also decreases. As a result, the voltage across R3 decreases and the voltage at the drain of B1 increases as does the voltage at the gate Ga1 of Ta1. The circuit B1, R1 to R5 shown in FIG. 2 thus operates as a threshold phase inverter stage, i.e. a controllable bias circuit. The gain of B1 can be adjusted to a correct value by means of a correct resistance dimensioning of R1-R5.

FIG. 3 shows the same embodiment as FIG. 2 in which the field effect transistor B1 is replaced by a bipolar transistor B2 whose base, emitter and collector constitute the input, reference and output electrodes, respectively. In principle, the operation of the circuit B2, R1-R5 corresponds to the operation of the circuit of FIG. 2 as described above and does not require any further explanation.

FIG. 4 shows a threshold phase inverter stage with a bias tetrode Tb whose second gate Gb2, the source and the drain constitute input, reference and output electrodes, respectively. The bias tetrode Tb is adjusted to a specific gain via a voltage divider R6 and R7 at the first gate Gb1 of the first FET Tb1. The gain control signal at the control input $I_C$ is given a correct value via the voltage divider R1 and R2 and applied to the gate of the second FET Tb2 of the bias tetrode Tb. In principle, the operation of the threshold phase inverter stage shown in FIG. 4 corresponds to the operation of the circuits of FIGS. 2 and 3.

Figure 6:
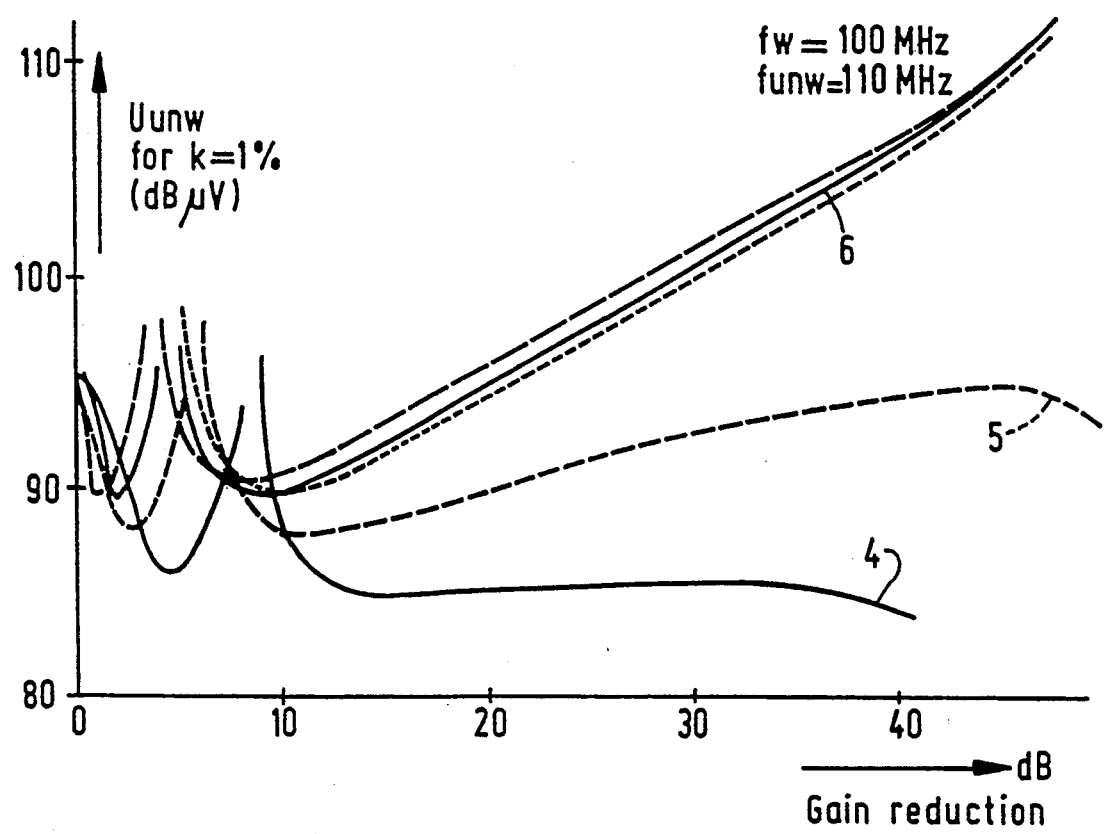
FIG. 6 shows some characteristic curves indicating the variation of the distortion in dependence upon the gain reduction when using a source resistor and when using the measure according to the invention.

Curves 4, 5, 6 in FIG. 6 show the variation of the distortion in a known controllable amplifier circuit having a constant gate bias voltage of the amplifier transistor Ta1 whose source is connected to ground, a similar known amplifier control circuit in which the source of the amplifier transistor Ta1 is connected to ground via a source resistor of 80 Ohms, and the controllable amplifier circuit according to the invention. An unmodulated desired carrier of 100 MHz together with an undesired carrier of 110 MHz amplitude-modulated with a test signal at a modulation depth of 80% are applied to the radio frequency signal inputs $I_{RF}$ of these amplifier circuits. As a result of non-linearities in the amplifier circuit a cross-modulation is produced, with the test signal appearing amplitude-modulated on the desired carrier of 100 MHz at the output $O_{RF}$ of the amplifier circuit. It was measured at which amplitude of the undesired modulated carrier of 110 MHz at the radio frequency input $I_{RF}$ the test signal appears amplitude-modulated on the desired carrier of 100 MHz at the output $O_{RF}$ with a modulation depth of 0.8%, i.e. 1% of the first-mentioned modulation depth. The cross-modulation giving rise thereto is also referred to as the 1% cross-modulation. It is obvious that the last-mentioned amplitude also increases with an increasing linearity.

It is apparent from curve 4 that the known controllable amplifier circuit without a source resistor produces 1% cross-modulation already at a comparatively small amplitude of the test signal in the substantially entire gain control range. It is apparent from curve 5 that notably with an increasing gain reduction a reduction of the cross-modulation, or a given gain linearization is obtained with the aid of a source resistor. However, curve 6 shows that the controllable amplifier circuit according to the invention yields a significant improvement as compared with the known controllable amplifier circuits using source negative feedback, in spite of the use of a comparatively low power supply voltage of 5 Volts.

We claim:

1. A controllable amplifier circuit comprising, successively, in a cascode arrangement between a power supply voltage and ground, a control transistor having a control input for applying a gain control signal thereto and a field effect amplifier transistor for a controllable amplification of an input signal applied to a gate input, thereof said control transistor varying the working point of the field effect amplifier transistor in the ohmic range in dependence upon the gain control signal at least in a part of the control range of the gain control signal, characterized in that the control input also is coupled via a controllable bias circuit to the gate input of the field effect amplifier transistor for applying a controllable bias voltage thereto, which voltage varies in the opposite direction to the gain control signal mainly in said part of the control range.

2. A controllable amplifier circuit as claimed in claim 1, wherein the controllable bias circuit comprises a threshold phase inverter stage for inverting the phase of the gain control signal and which is mainly active for variations of the gain control signal in said part of the control range, said part being limited by a threshold value at which the field effect amplifier transistor has its working point in the transition range between the saturation range and the ohmic range.

3. A controllable amplifier circuit as claimed in claim 2, wherein the phase inverter stage comprises, successively, in a cascode arrangement between ground and the power supply voltage, a further field effect transistor and a controllable resistor, wherein a gate source junction of the further field effect transistor is in parallel to the gate-source junction of the field effect amplifier transistor at a maximum gain of the field effect amplifier transistor for forming a current mirror therewith, said phase inverter stage also comprising means for realising said threshold value.

4. A controllable amplifier circuit as claimed in claim 3, wherein the further field effect transistor and the controllable resistor of the controllable bias circuit comprise first and second transistors, respectively, of a field effect transistor bias tetrode having first and second gates, a source and a drain, the gain control signal being applied to said second gate, said source being connected to ground, said first gate being short-circuited to the drain and said drain being connected to the power supply voltage via a load resistor and to the gate of the field effect amplifier transistor via a series resistor.

5. A controllable amplifier circuit as claimed in claim 4, wherein the ratio between the width and the length of the gate of the second transistor is smaller than that of the first transistor of said field effect transistor bias tetrode.

6. A controllable amplifier circuit as claimed in claim 5, wherein the field effect amplifier transistor and the control transistor comprise first and second transistors, respectively, of a field effect transistor amplifier tetrode which together with said field effect transistor bias tetrode are integrated on a common substrate.

7. A controllable amplifier circuit as claimed in claim 4, wherein the field effect amplifier transistor and the control transistor comprise first and second transistors, respectively, of a field effect transistor amplifier tetrode which together with said field effect transistor bias tetrode are integrated on a common substrate.

8. A controllable amplifier circuit as claimed in claim 2, wherein the phase inverter stage includes a transistor which has an input electrode to which the gain control signal is applied via a voltage divider for adjusting said threshold value, a reference electrode which is connected to ground and an output electrode which is connected to the power supply voltage via a load resistor and is coupled to the gate of the field effect amplifier transistor.

9. A controllable amplifier circuit as claimed in claim 2 wherein the controllable bias circuit has a high-ohmic output impedance.

10. A controllable amplifier circuit as claimed in claim 1 wherein the controllable bias circuit has a high-ohmic output impedance.

11. A controllable amplifier circuit comprising: in a cascode arrangement between a power supply voltage and ground, a control transistor having a control input for applying a gain control signal thereto and a field effect amplifier transistor for a controllable amplification of an input signal applied to a gate input, said control transistor varying the working point of the field effect amplifier transistor in the ohmic range in dependence upon the gain control signal at least in a part of the control range of the gain control signal, characterized in that a source electrode of the field effect amplifier transistor is DC connected to ground, the control input being coupled via a controllable bias circuit to the gate input of the field effect amplifier transistor for applying a controllable bias voltage thereto, which voltage varies continuously in the opposite direction to the gain control signal mainly in said part of the control range, and the controllable bias circuit comprises a threshold phase inverter stage for inverting the phase of the gain control signal and which is mainly active for variations of the gain control signal in said part of the control range, said part being limited by a threshold value at which the field effect amplifier transistor has it working point in the transition range between the saturation range and the ohmic range.

12. A controllable amplifier circuit as claimed in claim 11 wherein the phase inverter stage comprises, successively, in a cascode arrangement between ground and the power supply voltage, a further transistor and a controllable resistor, and wherein the further transistor is coupled to the field effect amplifier transistor so as to form therewith a current mirror.

13. A controllable amplifier circuit as claimed in claim 12 wherein the further transistor and the controllable resistor of the controllable bias circuit comprise first and second transistors, respectively, of a field effect transistor bias tetrode having first and second gates, a source and a drain, the gain control signal being applied to said second gate, said source being connected to ground, said first gate being short-circuited to the drain and said drain being connected to the power supply voltage via a load resistor and to the gate of the field effect amplifier transistor via a series resistor.

14. A controllable amplifier circuit as claimed in claim 11 wherein the phase inverter stage includes a transistor which has an input electrode to which the gain control signal is applied via a voltage divider for adjusting said threshold value, a reference electrode which is connected to ground and an output electrode which is connected to the power supply voltage via a load resistor and is coupled to the gate of the field effect amplifier transistor.

* * * * *